US006476883B1

(12) United States Patent
Salimes et al.

(10) Patent No.: US 6,476,883 B1
(45) Date of Patent: Nov. 5, 2002

(54) ENCLOSURE SYSTEM FOR ELECTRONIC DISPLAYS AND METHOD FOR MAKING SAME

(75) Inventors: Christopher J. Salimes, Brookfield, WI (US); Brad D. Hammel, Greenfield, WI (US); Scott S. Liebert, Greenfield, WI (US)

(73) Assignee: Adaptive Micro Systems, Inc., Milwaukee, WI (US)

( * ) Notice: Subject to any disclaimer, the term of this patent is extended or adjusted under 35 U.S.C. 154(b) by 0 days.

(21) Appl. No.: 09/566,109

(22) Filed: May 5, 2000

(51) Int. Cl.[7] .............................. G06F 1/16; H05K 5/00
(52) U.S. Cl. ...................... 349/58; 345/156; 345/905; 361/695; 361/681
(58) Field of Search .............................. 349/58, 60, 61; 345/156, 905; 361/681, 695

(56) References Cited

U.S. PATENT DOCUMENTS

| | | | |
|---|---|---|---|
| 5,313,729 A | | 5/1994 | Sakai et al. ..................... 40/452 |
| 5,375,005 A | * | 12/1994 | Komano ....................... 359/48 |
| 5,442,470 A | * | 8/1995 | Hashimoto .................... 359/83 |
| 5,450,301 A | | 9/1995 | Waltz et al. ................. 362/231 |
| 5,623,392 A | * | 4/1997 | Ma .............................. 361/681 |
| 5,736,686 A | * | 4/1998 | Perret, Jr. et al. ............. 178/18 |
| 5,869,919 A | * | 2/1999 | Sato et al. .................... 313/17 |
| 5,872,926 A | | 2/1999 | Levac et al. ........... 395/200.36 |
| 6,104,451 A | * | 8/2000 | Matsuoka et al. ............ 349/58 |
| 6,198,222 B1 | * | 3/2001 | Chang ........................ 313/582 |

OTHER PUBLICATIONS

ALPHA™ Get the message; 7 pages; ©Copyright 1998 Adaptive Micro Systems, Inc., Form No. 9700–0044.
All American Scoretables, All American Scoreboards®; 2 pages; A Product of Everbrite, Inc.
Know the score All American LED Indoor Scoreboards; 4 pages; All American Scoreboards®—A Product of Everbrite, Inc.
ALPHAVISION™ Industrial Information Displays; 2 pages; ©Copyright 1998, Issued 1/98, Form No. 9702–0023.
Wireless Message Display Solutions For Business Communications; ALPHA™; 4 pages; ©Copyright 1996—Adaptive Micro Systems, Inc., © 1996 Motorola, Inc., Form No. 9708–8088.
ALPHA198 Digital Clock Synchronized Serial Version; 2 pages; ©Copyright 1997—Adaptive Micro Systems, Inc., Revision Date Feb. 1997, Form No. 9703–3003–A.
ALPHA™ IR Message Loader; 2 pages; Copyright 1998—Adaptive Micro Systems, Inc., Issue Date 3/98; Form No. 9706–5002.

(List continued on next page.)

Primary Examiner—Lynn D. Feild
(74) Attorney, Agent, or Firm—Foley & Lardner (57) ABSTRACT

The present invention relates to an enclosure for electronic displays including a frame, at least one coupling assembly coupled to the frame, wherein one of the coupling assembly and the frame includes a plurality of recesses and the other of the body and the frame includes a plurality of protrusions configured for mating alignment with the recesses, a display module disposed within the frame, a front panel coupled to the frame, and a rear panel coupled to the frame. The present invention further relates to a method of manufacturing the enclosure including providing at least one side wall, providing a corner assembly, wherein the side wall has a plurality of recesses and the corner assembly has a plurality of corresponding protrusions for mating engagement with the plurality of recesses, and sliding the protrusions into the recesses to form a secure fit, whereby secondary operations, such as drilling holes or punching holes, in the side wall are unnecessary to complete the mating engagement.

26 Claims, 12 Drawing Sheets

OTHER PUBLICATIONS

ALPHA™ Director; 2 pages; ©Copyright 1997—AMS, Inc, Issued 2/98, Form No. 9709–2011.
ALPHA™ PrintPak; 1 page; ©Copyright 1995—Adaptive Micro Systems, Inc., Issue Date 5/95, Form No. 9708–8070.
ALPHA™ Big Dot™; 2 pages; ©Copyright 1994, 1995—Adaptive Micro Systems, Inc., Issue Date 12/95, Form No. 9703–8003–A.
ALPHA™ 7000 Series; 2 pages; ©Copyright 1996—Adaptive Micro Systems, Inc, Issue Date 9/97, Form No. 9700–0031–T.
ALPHA™ 4000 Series; 2 pages; ©Copyright 1996—Adaptive Micro Systems, Inc., Revision Date 9/97, Form No. 9701–8002–Rev A.
ALPHA™ 300 Series; 2 pages; ©Copyright 1995—Adaptive Micro Systems, Inc., Issue Date 8/95, Form No. 9700–0030–T.
ALPHA™ 215 Series; 2 pages; ©Copyright 1995—Adaptive Micro Systems, Inc., Revision Date 3/95, Form No. 9704–4001–A.
ALPHA™ 790i Outdoor Display; 4 pages; Copyright© 1990 Adaptive Micro Systems, Inc., Form #9704–9001.
ALPHA™ Personal Priority Display For Business Communications; 5 pages (including insert); ©Copyright 1997—Adaptive Micro Systems, Inc., Printed 12/97, Form No. 9708–5004.
ALPHA™ SOLAR™ Quality LED Outdoor Business Communication; 5 pages (including insert); ©Copyright 1997—Adaptive Micro Systems; Inc., Form No. 9705–1013.
ALPHAVISION™ Modular Display System; 8 pages; ©Copyright 1995—AMS, Inc., Rev. 9/96, Form No. 9702–0001.

* cited by examiner

ENCLOSURE SYSTEM FOR ELECTRONIC DISPLAYS AND METHOD FOR MAKING SAME

FIELD OF THE INVENTION

This invention relates generally to the field of display enclosures for indoor and outdoor applications. More particularly, the invention relates to an improved enclosure for electronic displays that greatly reduces material and assembly costs without compromising the enclosure's function or aesthetics. The invention also relates to a method for making the improved message center.

BACKGROUND OF THE INVENTION

Enclosures for electronic displays having ventilation fans are known. These enclosures typically include side walls, a rear equipment panel, a front window, one or more fans and display modules mounted within the enclosures. Two methods are primarily used for manufacture of enclosures for electronic displays. The first manufacturing method involves forming a sheet metal enclosure, which involves the steps of shearing a flat piece of sheet metal, punching the required holes into the sheet metal, forming additional metal parts, and welding or fastening the sheet metal and the parts together. This method requires expensive and time-consuming operations such as machine set-up, welding and metal finishing, and is typically only cost effective for large production volumes. The second manufacturing method utilizes an aluminum extrusion. In this method the case is extruded in the desired shape, and, therefore, most of the machine set-up time and costs are eliminated. Although this method is better suited for an enclosure for electronic displays, this method still requires costly secondary operations, such as drilling, tapping and punching holes, for the mounting of additional components such as a fans, power supplies, circuit boards, mounting brackets, panels, etc. Secondary operations can significantly increase the manufacturing cost of an extrusion design.

Larger enclosures for electronic displays typically include one or more fans for ventilating the enclosure. The mounting of such fans typically requires additional secondary operations and additional bracketing or other means to support the fan or fans in the enclosure. The location of the fan or fans within the enclosure can negatively affect the aesthetics of an enclosure or reduce the mounting alternatives for the enclosure. A fan mounted to the front of an enclosure can reduce the available front display area of the enclosure and make the enclosure visually less appealing. An enclosure with a rear mounted fan may not be able to be directly mounted to a wall or ceiling without hindering the operation of the fan.

Accordingly, it would be advantageous to provide an enclosure for electronic displays that overcomes these disadvantages and other disadvantages. In particular, it would be advantageous to provide an enclosure that is less expensive to manufacture. What is needed is an enclosure that eliminates most secondary operations such as the drilling, tapping and punching of holes. What is also needed is an enclosure with fans that does not require the installation of additional supports, does not reduce the aesthetics or mounting options of the enclosure, and can be assembled without secondary operations. It would be beneficial to provide an enclosure design that is readily adaptable to most indoor and outdoor applications. It would be advantageous to provide a method of making an enclosure that is less expensive, quicker, cleaner, and safer.

SUMMARY OF THE INVENTION

The present invention relates to an enclosure for electronic displays. The enclosure includes a frame and at least one coupling assembly coupled to the frame, wherein one of the coupling assembly and the frame includes a plurality of recesses and the other of the coupling assembly and the frame includes a plurality of protrusions configured for mating alignment with the recesses. The enclosure further includes a display module disposed within the frame, a front panel coupled to the frame, and a rear panel coupled to the frame.

The present invention also relates to an enclosure for electronic displays, wherein the enclosure includes a plurality of side walls, each side wall having a plurality of recesses, and at least one corner assembly. The enclosure further includes a means for coupling two side walls to each corner assembly, a front panel coupled to at least one side wall, a rear panel coupled to at least one side wall, and a display module disposed in the enclosure.

The invention further relates to an enclosure for electronic displays including at least two side walls, at least one side wall having a plurality of recesses, and at least two corner assemblies, each corner assembly connecting two side walls to form a frame. The enclosure further includes a front panel slidably coupled to the side walls, a rear panel slidably coupled to the side walls, a module panel slidably coupled to the side walls and at least one display module coupled to the module panel.

The present invention further relates to a method of manufacturing an enclosure for electronic displays. The method includes providing at least one side wall, providing a corner assembly, wherein the side wall has a plurality of recesses and the corner assembly has a plurality of corresponding protrusions for mating engagement with the plurality of recesses, and sliding the protrusions into the recesses to form a secure fit, whereby secondary operations, such as drilling holes or punching holes, in the side wall are substantially unnecessary to complete the mating engagement except for mounting the parts together.

BRIEF DESCRIPTION OF THE DRAWINGS

The invention will become more fully understood from the following detailed description, taken in conjunction with the accompanying drawings, wherein like reference numerals refer to like parts, in which.

DESCRIPTION OF THE PREFERRED EMBODIMENTS

Figure 1:
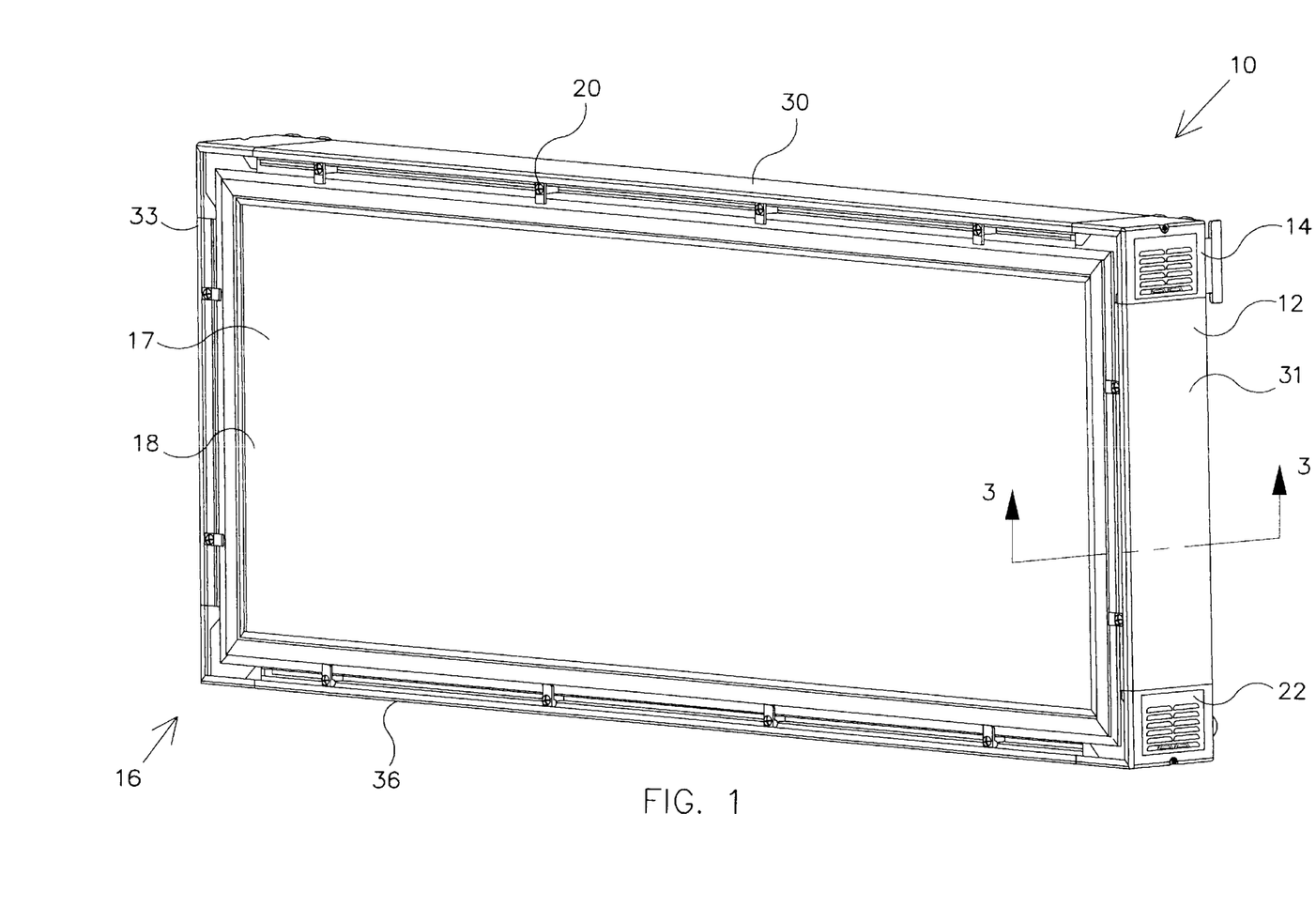
FIG. 1 is a front perspective view of an enclosure for electronic displays in accordance with an exemplary embodiment of the present invention.

Referring to FIG. 1, an enclosure 10 for electronic displays is shown. Enclosure 10 includes four side walls 12 slidably connected to four corner assemblies 14 to form a frame 16. Side walls 12 include upper side wall 30, right side wall 31, left side wall 33, and lower side wall 36. It is understood that enclosure 10 may have more or less than four side walls 12 in alternative shapes of enclosure 10 (e.g., triangle, hexagon, circle, etc.). According to an exemplary embodiment, enclosure 10 further includes a front panel 17, shown in FIG. 1 as a generally translucent window 18, secured to the frame 16 by a set of clips 20. According to an exemplary embodiment, window 18 is a polycarbonate material. Each corner assembly 14 includes a louver 22 coupled to each corner assembly 14 (e.g., by a snap-tight fit). Each side wall 12 is an extrusion and an aluminum extrusion in an exemplary embodiment. According to an exemplary embodiment, enclosure 10 can satisfy indoor, outdoor and National Electrical Manufacturers Association ("NEMA") 12 applications. A NEMA 12 application provides protection against incidental contact, falling dirt, circulating lint, fibers, and light splashing of liquids.

Figure 2:
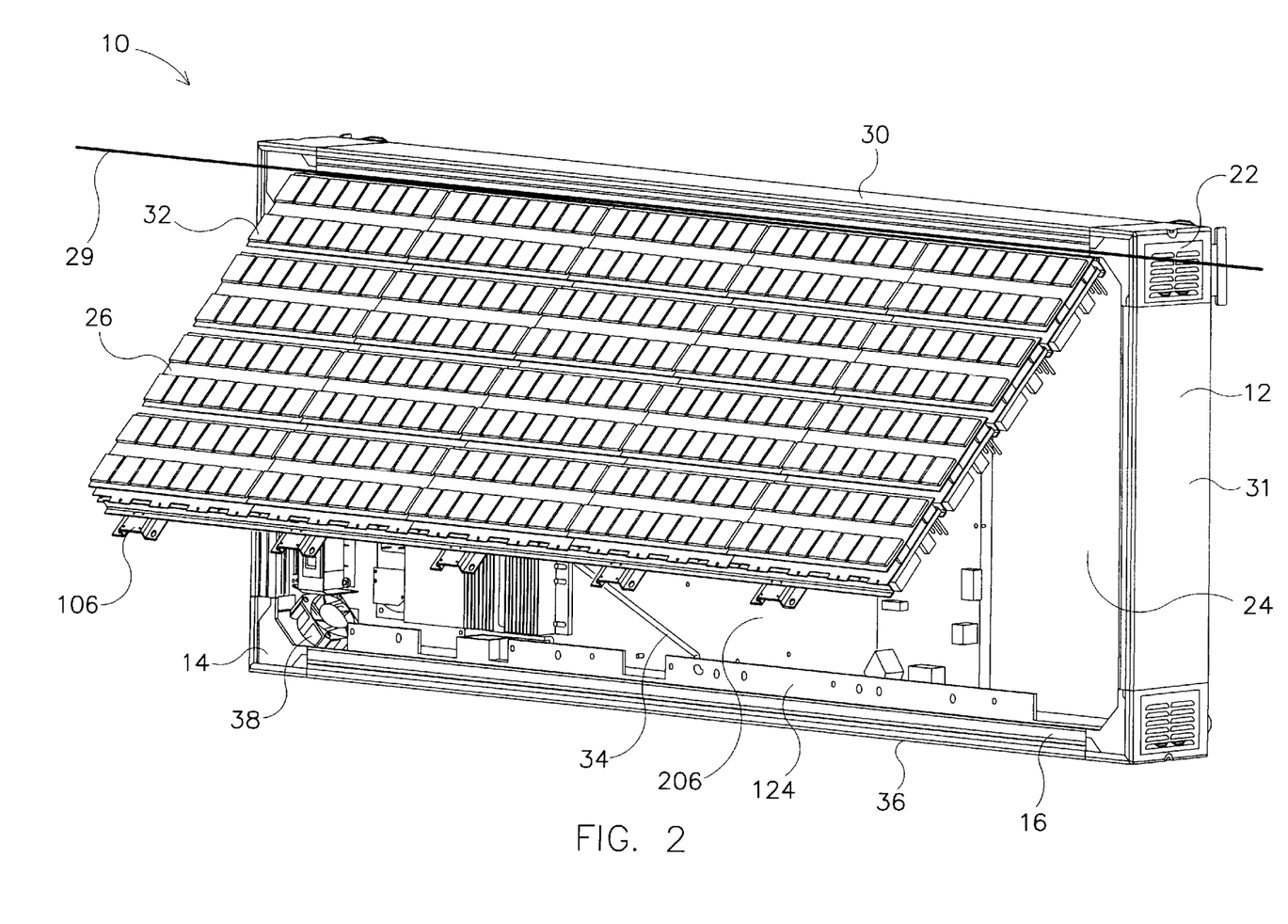
FIG. 2 is a front perspective view of the enclosure of FIG. 1 with the window removed and the hinged module rack in an extended position.

Referring to FIG. 2, enclosure 10 further includes a rear panel 24 coupled to side walls 12, a hinged module rack 26 coupled to upper side wall 30. In a closed position, hinged module rack 26 is aligned parallel to and between front panel 17 and rear panel 24. Hinged module rack 26 rotates forwardly about an axis 29 longitudinally extending along upper side wall 30 to an open position. A plurality of display modules 32 (e.g., seven-segment light-emitting diodes, light-emitting diodes, lamps, bulbs, etc.) are mounted to hinged module rack 26 by fasteners (not shown). A safety bar 34 extends from the rear face of hinged module rack 26 to couple hinged module rack 26 to a mounting rail bracket 124 mounted to lower side wall 36, thereby holding hinged module rack 26 in an open position. A fan 38 is mounted to corner assembly 14 for ventilating enclosure 10. Safety bar 34 allows hinged module rack 26 to be maintained in an open position thereby allowing front access to rear panel 24 and equipment sub-panel 206. Front access eliminates the need to remove enclosure 10 from, for example, a wall in order to access equipment on rear panel 24 or equipment sub-panel 206.

Figure 3:
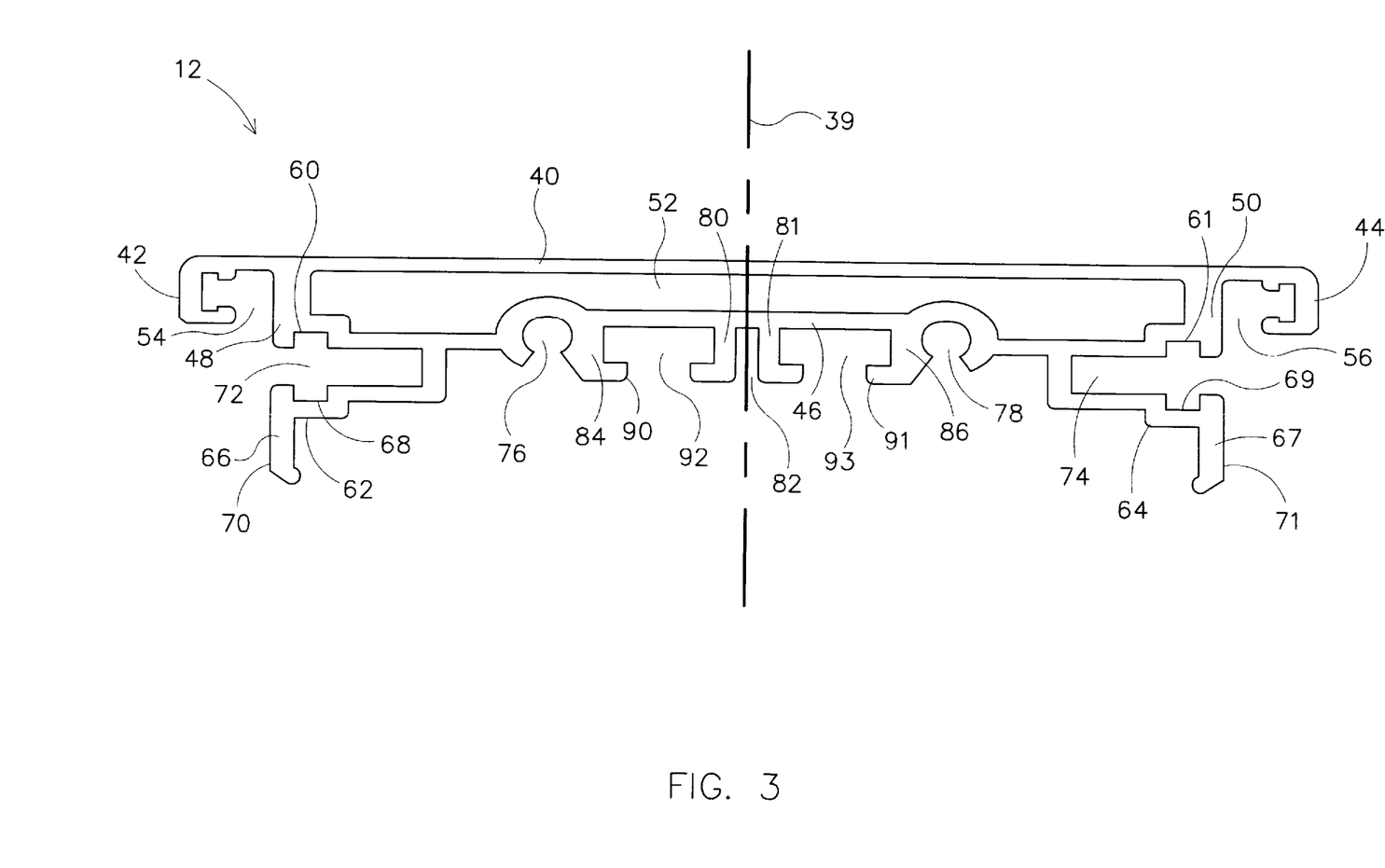
FIG. 3 is a partial cut-away view of the side wall extrusion of FIG. 1.

Referring to FIG. 3, a cross-sectional view of one of side walls 12 is shown, each of side walls 12 being of similar construction. Side wall 12 is an extrusion that is symmetrical about a longitudinal center line 39. Side wall 12 includes an outer sheet 40 with opposing first and second hooked ends 42, 44. First and second hooked ends 42, 44 extend inwardly in a generally perpendicular direction from outer sheet 40 and then extend toward one another. Side wall 12 further includes a longitudinally extending platform 46 spaced inwardly and generally parallel to outer sheet 40. Platform 46 includes opposing first and second edges 48, 50 extending outwardly generally perpendicular from platform 46 to integrally connect to outer sheet 40. Platform 46, including first and second edges 48, 50, and outer sheet 40 form a channel 52. First hooked end 42, outer sheet 40, and first edge 48 of platform 46 form a front channel 54. Second hooked end 44, outer sheet 40, and second edge 50 of platform 46 form a rear channel 56. Platform 46 further includes an outwardly extending platform recess 60, 61 adjacent to each first and second edges 48, 50. First and second inwardly extending and opposing stepped members 62, 64, each having a free end 66, 67, extend inwardly generally perpendicular to platform 46 and then extend away from one another generally parallel to platform 46 toward free end 66, 67. Each free end 66, 67 includes a stepped member recess 68, 69 positioned opposite platform recess 60, 61 and a bracing member 70, 71 positioned generally perpendicular to outer sheet 40. Platform 46, including platform recess 60, 61 and first and second stepped members 62, 64, including stepped member recess 68, 69, form first and second t-shaped channels 72, 74, respectively. Platform 46 further includes longitudinally extending first and second circular slots 76, 78 positioned adjacent to first and second stepped members 62, 64, respectively, toward the longitudinal centerline 39 of side wall 12. First and second circular slots 76, 78 open inwardly and are disposed parallel to one another. Platform 46 further includes two inwardly extending and opposing right angled protrusions 80, 81. Inwardly extending and opposing right angled protrusions 80, 81 are positioned adjacent to one another and spaced apart to form a center groove 82 aligned with the longitudinal centerline 39 of platform 46. Platform 46 further includes inwardly extending first and second extensions 84, 86 positioned adjacent to first and second circular slots 76, 78, respectively. First and second extensions 84, 86 each include a stub 90, 91 extending perpendicular from first and second extensions 84, 86 toward the longitudinal centerline of side wall 12. First and second extensions 84, 86 platform 46 and right angled protrusions 80, 81 forming two longitudinally extending mounting slots 92, 93. According to an exemplary embodiment, side walls 12 are 4.25 inches in depth and approximately 0.09 inches in thickness.

Figure 4:
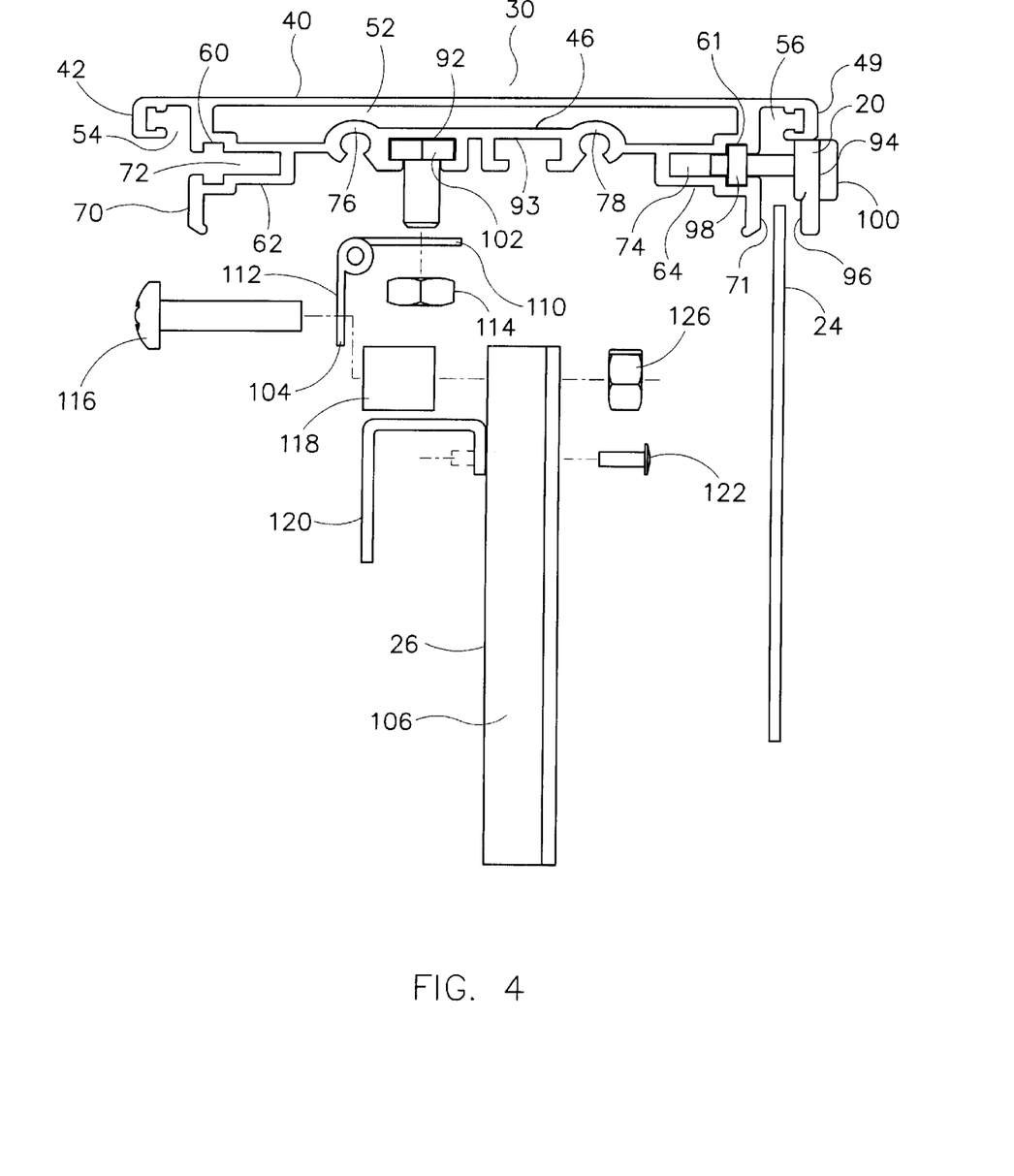
FIG. 4 is a cross-sectional assembly view of the upper side wall, the rear panel and the hinged module rack of FIG. 2.

Referring to FIG. 4, the attachment of rear panel 24 to upper side wall 30 is shown. Rear panel 24 is connected to upper side wall 30 by clips 20. Each clip 20 has an aperture 94 and an inwardly extending mounting surface 96. Rear panel 24 is placed against bracing member 71 of second stepped member 64. A nut 98, one for each clip 20, is slid into second t-shaped channel 74. A fastener, shown as a screw 100, is inserted through aperture 94 of each clip 20 and into nut 98. When assembled, clip 20 braces against second hooked end 44 of upper side wall 30 and rear panel 24 is secured to upper side wall 30 between mounting surface 96 of clip 20 and bracing member 71. Second t-shaped channel 74 serves as screw relief for screw 100. Other fastening arrangements, such as resilient members, snap-tight assemblies, etc., are contemplated. Referring to FIG. 1, front panel 17 connects to side walls 12 at first hooked end 42 in a similar manner that rear panel 24 connects to upper side wall 30. Rear panel 24 also connects to remaining side walls 12 in a similar manner as rear panel 24 connects to upper side wall 30. Each clip 20 is pivotable about screw 100 to allow for easy removal and re-installation of front panel 17 or rear panel 24. Mounting of rear panel 24 and front panel 17 to side walls 12, in the manner described above, eliminates secondary operations such as drilling or punching, followed by tapping, of holes into side walls 12, rear panel 24 or front panel 17 to accommodate fasteners.

Figure 5:
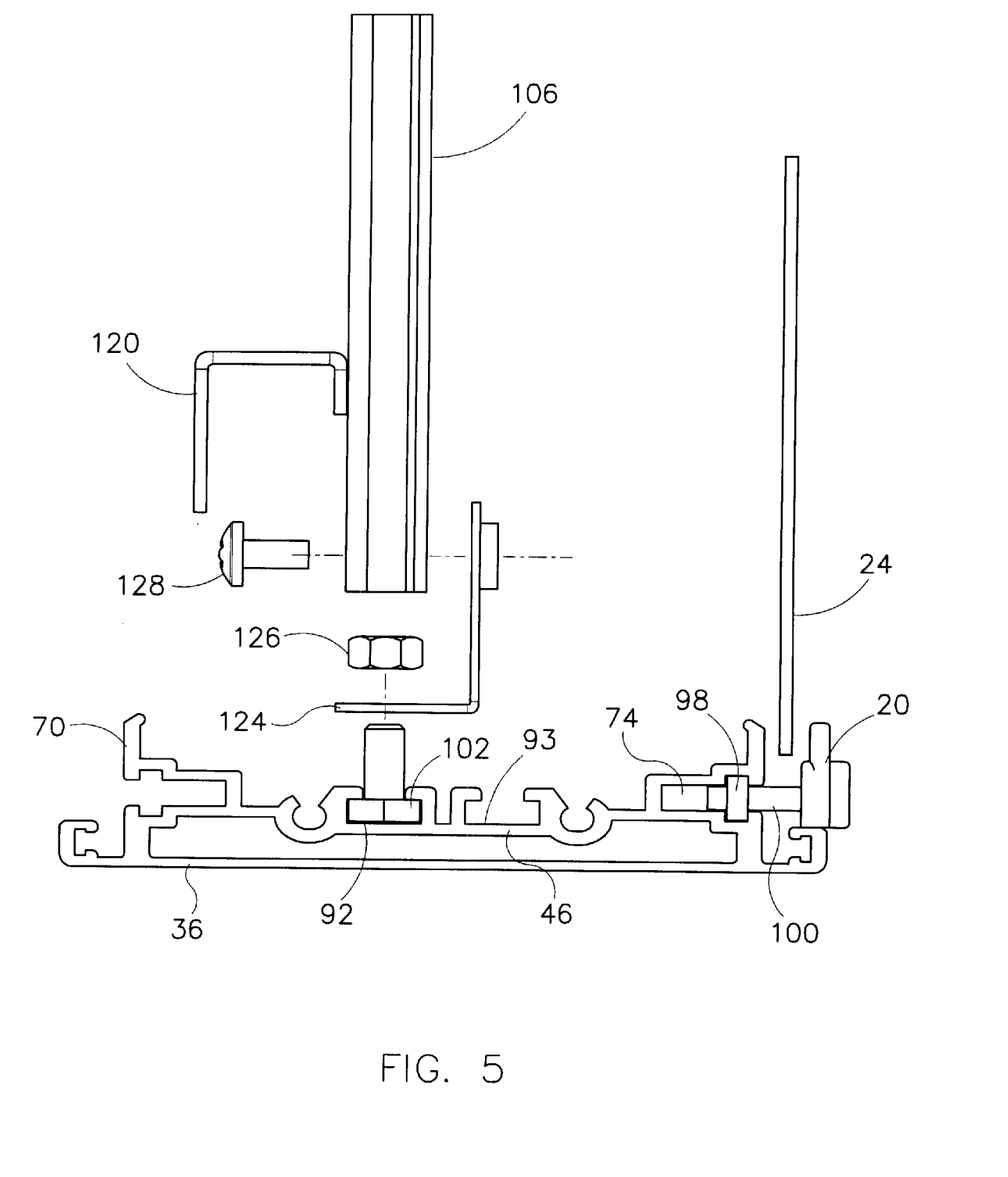
FIG. 5 is a cross-sectional assembly view of the lower side wall, the rear panel, and the hinged module rack of FIG. 2.

Referring further to FIGS. 4 and 5, hinged module rack 26 connects to mounting slots 92, 93 of upper side wall 30. A set of fasteners, shown as bolt 102, are inserted into mounting slot 92, 93 of upper and lower side walls 30, 36. A hinge bracket 104 couples a plurality of mounting rails 106 to upper side wall 30. According to an exemplary embodiment, hinge bracket 104 is made of Type 304 stainless steel. Hinge bracket 104 includes a top arm 110 positioned parallel to upper side wall 30 and a forward arm 112 positioned generally perpendicular to upper side wall 30, when forward arm 112 in the closed position. Forward arm 112 and top arm 110 each include a plurality of apertures (not shown) for coupling mounting rails 106 to upper side wall 30. Each bolt 102 extends through top arm 110 into a module rack nut 114. Each mounting rail 106 is connected to forward arm 112 of hinge bracket 104 by a fastener, shown as a rail screw 116. Rail screw 116 is inserted through forward arm 112 and a spacer 118, that is inserted through mounting rail 106, to connect with a mounting rail nut 126. A plurality of spaced apart secondary mounting rails 120 are placed generally perpendicular to mounting rails 106 and are coupled to mounting rails 106 by fasteners, shown as rivet 122. Each mounting rail 106 couples to lower side wall 36 through bolt 102 extending through mounting rail bracket 124 into a mounting rail nut 126. A fastener, shown as lower mounting screw 128, is inserted through mounting rail 106 and connects mounting rail 106 to mounting rail bracket 124. The mounting of hinge bracket 104 and mounting rail bracket 124 to upper and lower side walls 30, 36, respectively, through mounting slots 92, 93 eliminates secondary operations such as drilling or punching, followed by tapping, of holes into side wall 12 to accommodate fasteners.

Figure 6:
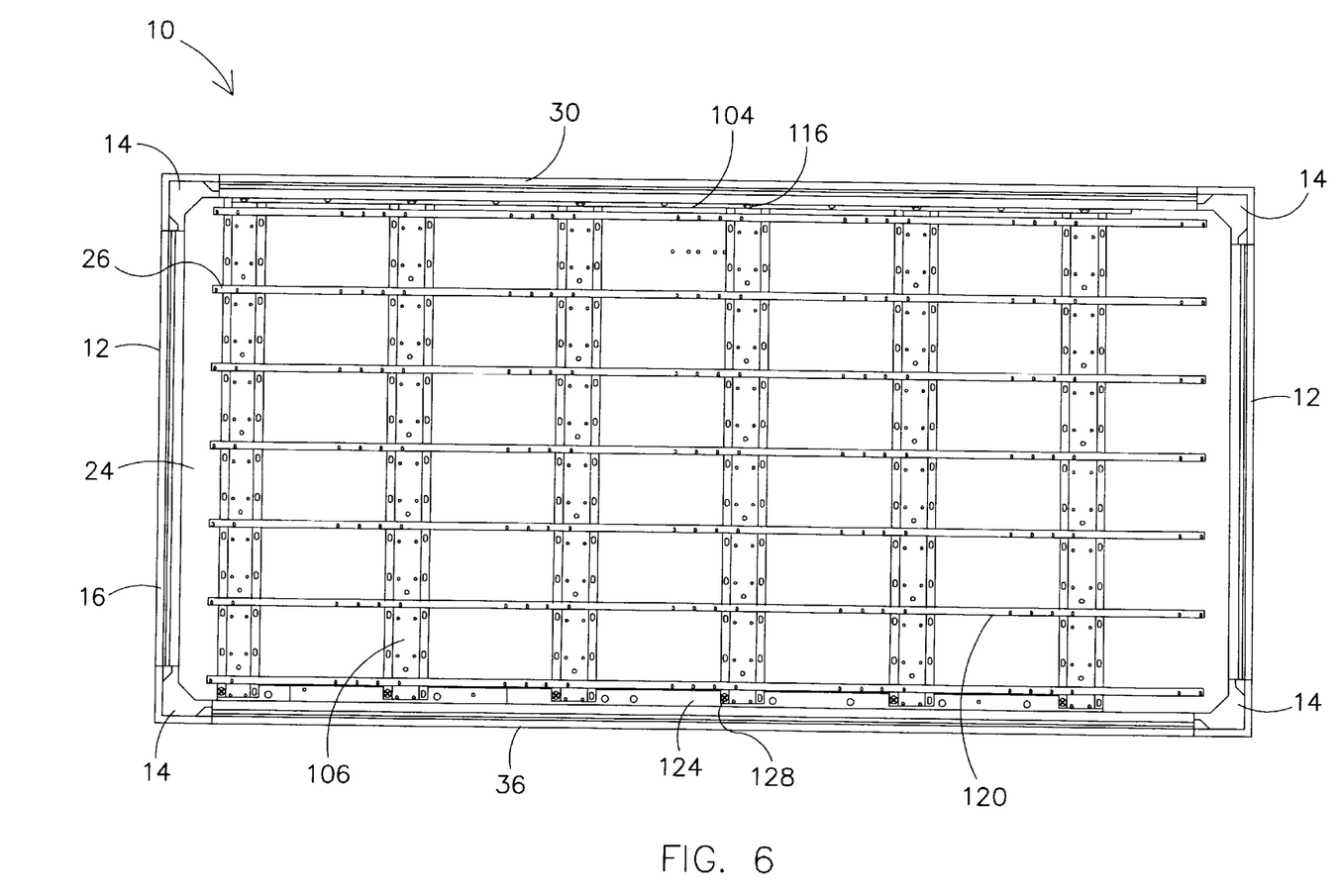
FIG. 6 is a front view of the enclosure of FIG. 1 with the window and the equipment, including display modules, removed.

Referring to FIG. 6, spaced apart mounting rails 106 of hinged module rack 26 extend from upper side wall 30 to lower side wall 36, though in alternative arrangements, module rack 26 may occupy only a portion of the space between upper side wall 30 and lower side wall 36. Spaced apart secondary mounting rails 120 extend transversely across and are coupled to mounting rails 106. Mounting rails 106 and secondary mounting rails 120 are configured for the mounting of display modules 32 and other equipment. Upon disconnection of lower mounting screws 128, hinged module rack 26 can be forwardly rotated about the longitudinal axis of hinge bracket 104 to provide front access to rear panel 24.

Figure 7:
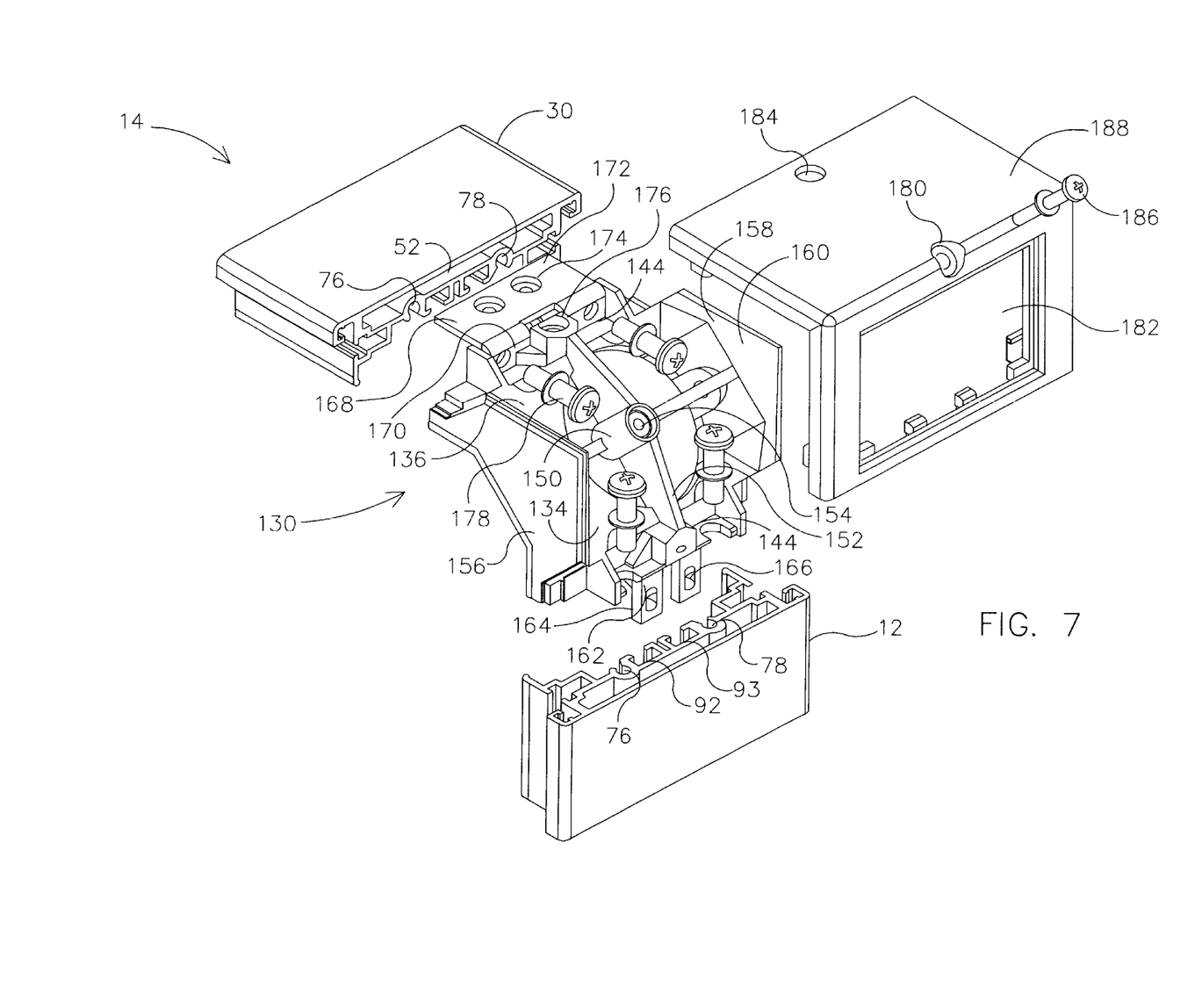
FIG. 7 is a perspective assembly view of a corner assembly of FIG. 1.
Figure 8:
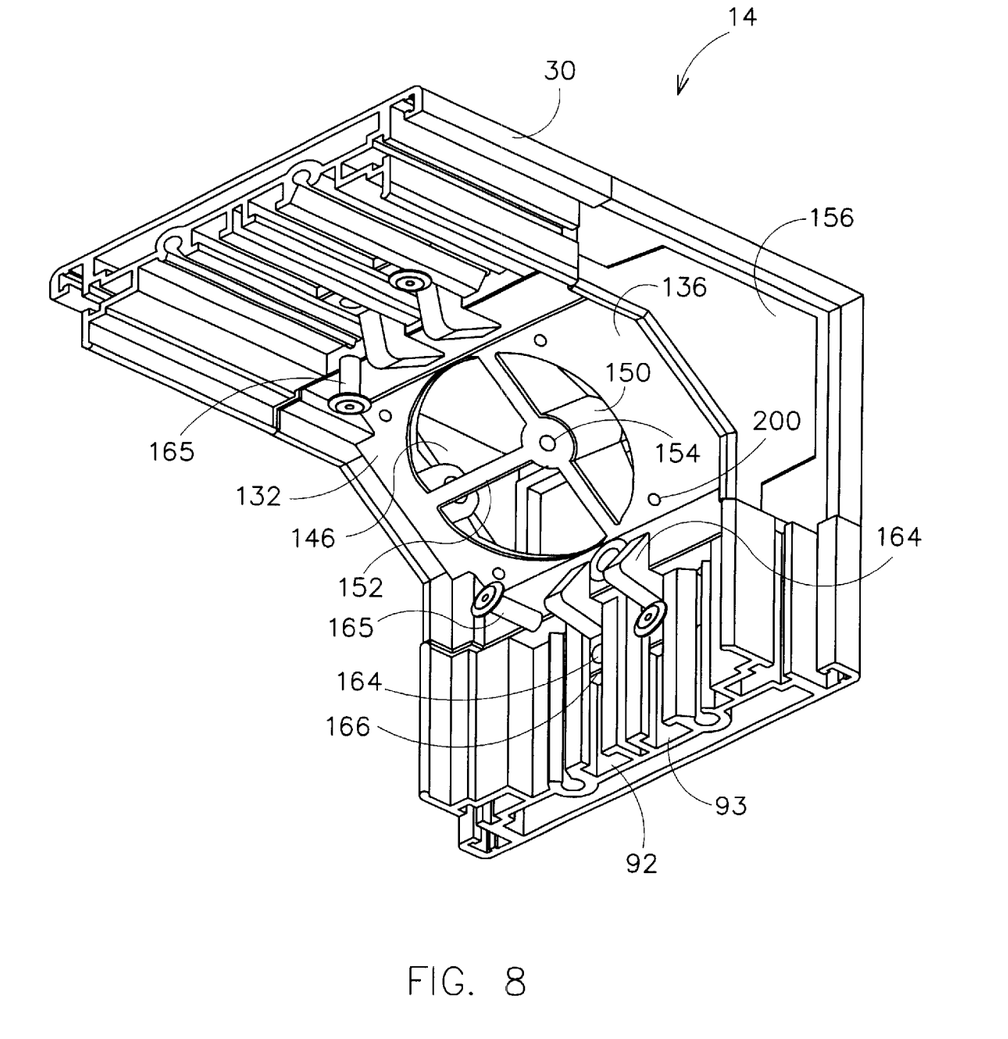
FIG. 8 is a perspective view of the inner surface of a corner assembly of FIG. 1.

Referring to FIGS. 7 and 8, corner assembly 14 includes a corner body 130, preferably an aluminum casting, having an inner surface 132 (not shown in FIG. 7) and an outer surface 134. Body 130 includes a base plate 136 that is formed to first and second side plates 156, 158. Base plate 136 having opposing mounting edges 144 and a circular void 146 disposed between first and second side plates 156, 158 and mounting edges 144. A shaft 150 is disposed within circular void 146 and is coupled to base plate 136 by at least three trusses 152 extending radially from shaft 150. In an exemplary embodiment, four trusses couple shaft 150 to base plate 136. Shaft 150 includes a bore 154 axially extending through shaft 150. First and second side plates 156, 158 extend generally perpendicular from base plate 136 and each side plate 156, 158 includes an outwardly projecting corner 160 that substantially covers either side of body 130. A mounting member 162 obliquely extends from base plate 136 at each mounting edge 144. Mounting member 162 includes two adjacent tongues 164, each tongue 164 having a tongue aperture 166. Corner assemblies 14 coupled to upper side plate 30, further include a corner support bracket 168 placed over tongues 164 and one mounting edge 144 of base plate 136. Corner support bracket 168 includes a mounting end 170 connected to mounting edge 144 and a tang 172 formed generally perpendicular to mounting end 170 and obliquely extending from base plate 136. Tang 172 includes two tang apertures 174, each tang aperture 174 aligns with each tongue aperture 166. Body 130 further includes a support hole 176 positioned adjacent to mounting edge 144. Support hole 176 is sized to accommodate an eyebolt or other support means (not shown) for top hanging or mounting of enclosure 10. Corner assembly 14 slidably couples to side walls 12. Each tongue 164 slidably connects to mounting slots 92, 93 of side wall 12. For corner assemblies 14 coupled to upper side wall 30, tang 172 of corner support bracket 168 slidably connects to channel 52 of side wall 30. Fasteners, shown as circular slot screws 178, extend through mounting brackets 162 of base plate 136, and mounting end 170 of corner support bracket 168 for corner assemblies 14 connected to upper side wall 30, into first and second circular slots 76, 78 of upper side wall 30 to connect corner assembly 14 to upper side wall 30. Corner assembly 14 further includes a cover 188 having a cover aperture 180, and a ventilation opening 182 positioned generally perpendicular to a cover support hole 184. Cover 188 is fastened to outer surface 134 of body 130 by a fastener, shown as a cover screw 186, that extends through cover aperture 180 and attaches to bore 154 of shaft 150. Referring to FIG. 1, louver 22 is connected to cover 180 over ventilation opening 182. According to an exemplary embodiment, louver 22 is made of injection molded plastic and includes a filter for filtering incoming air to meet NEMA 12 air quality requirements. The slidable connection of mounting member 162 into side wall 12, the attachment of corner support bracket 168 into upper side wall 30, the attachment of circular slot screws 178 into first and second circular slots 76, 78 of side wall 12, and the attachment of cover 188 to shaft 150 of corner assembly 14, all eliminate secondary operations such as drilling or punching, followed by tapping, of holes into side wall 12 to connect corner assembly 14 or to accommodate fasteners.

Figure 9:
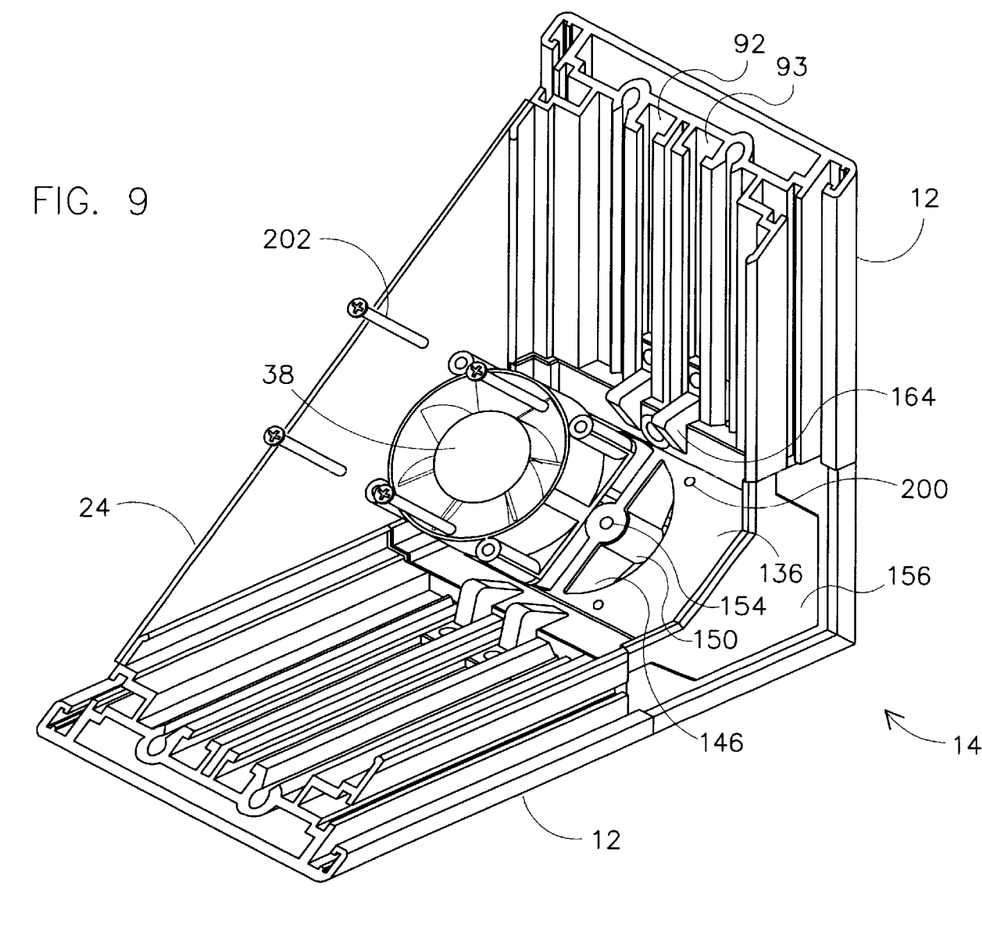
FIG. 9 is a perspective view of the inner surface of a corner assembly with a cooling fan of FIG. 1.

Referring to FIGS. 8 and 9, adjacent tongues 164 extend from base plate 136. Mounting bracket tongue fasteners 165 connect tongues 164 to mounting slots 92, 93. Base plate 136 further includes fan apertures 200 on inner surface 132 of body 130. Fan 38 attaches to inner surface 132 of body 130 of corner assembly 14. Fasteners, shown as fan screws 202, extend through fan 38 and connect fan 38 to corner assembly 14 at fan apertures 200.

Figure 10:
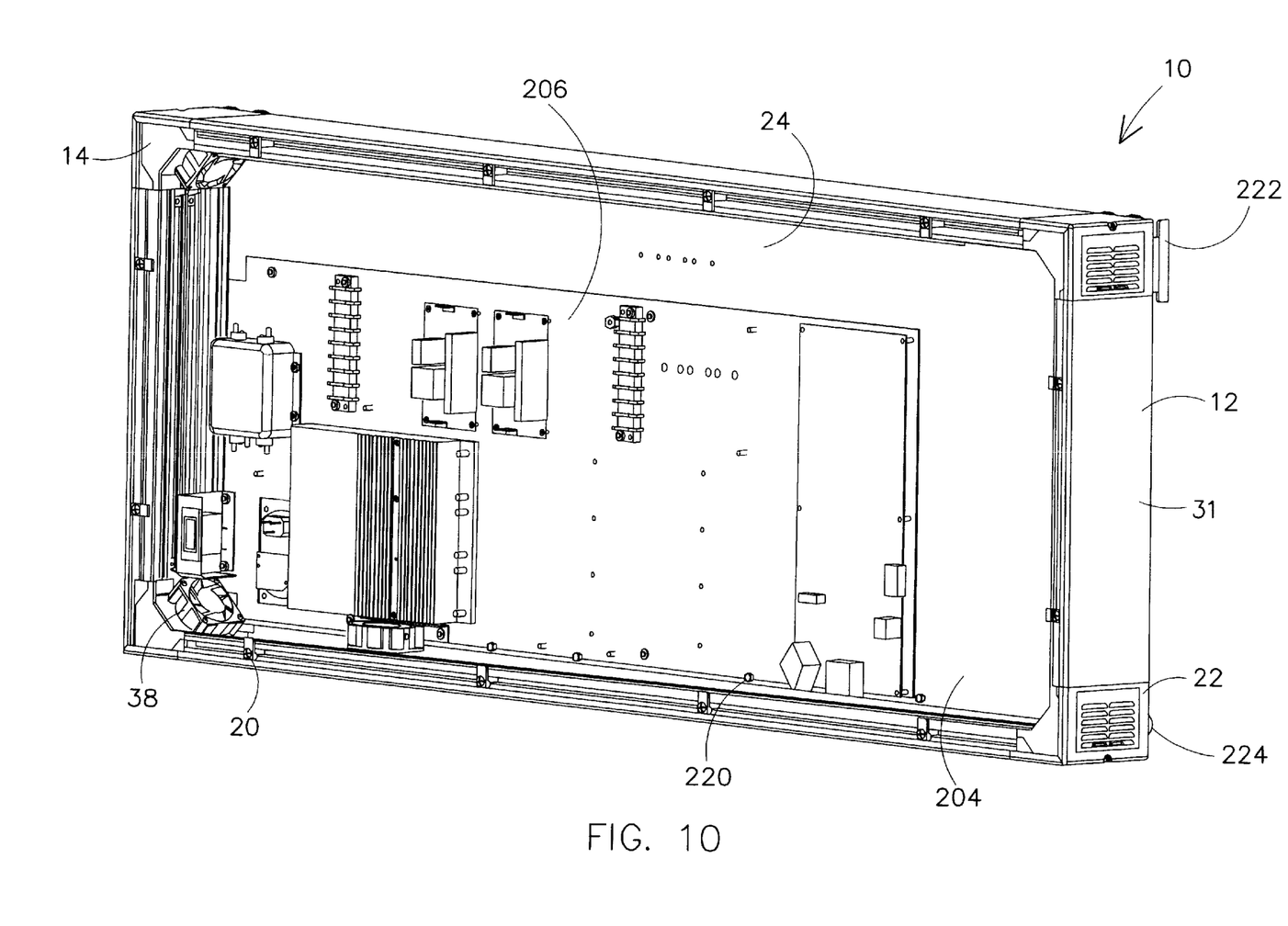
FIG. 10 is a front perspective view of the enclosure of FIG. 1 with the window and the hinged module rack removed.

Referring to FIG. 10, rear panel 24 has an inner surface 204 positioned opposite a back surface (not shown). An equipment sub-panel 206 connected to inner surface 204 of rear panel 24 by fasteners, shown sub-panel mounting studs 220. Equipment sub-panel 206 is configured for the mounting of equipment such as power supplies and a controller board. Mounting such equipment to equipment sub-panel 206 reduces the number of holes required in rear panel 24. Wall hanging brackets 222 and spacers 224 for wall mounting of enclosure 10 extend from corner assemblies 14 at rear panel 24. According to an exemplary embodiment, rear panel 24 is a thin gauge decorative panel with few holes. Also, according to an exemplary embodiment, equipment sub-panel 206 is an aluminum sheet having a thickness of approximately 0.08 inches.

Figure 11:
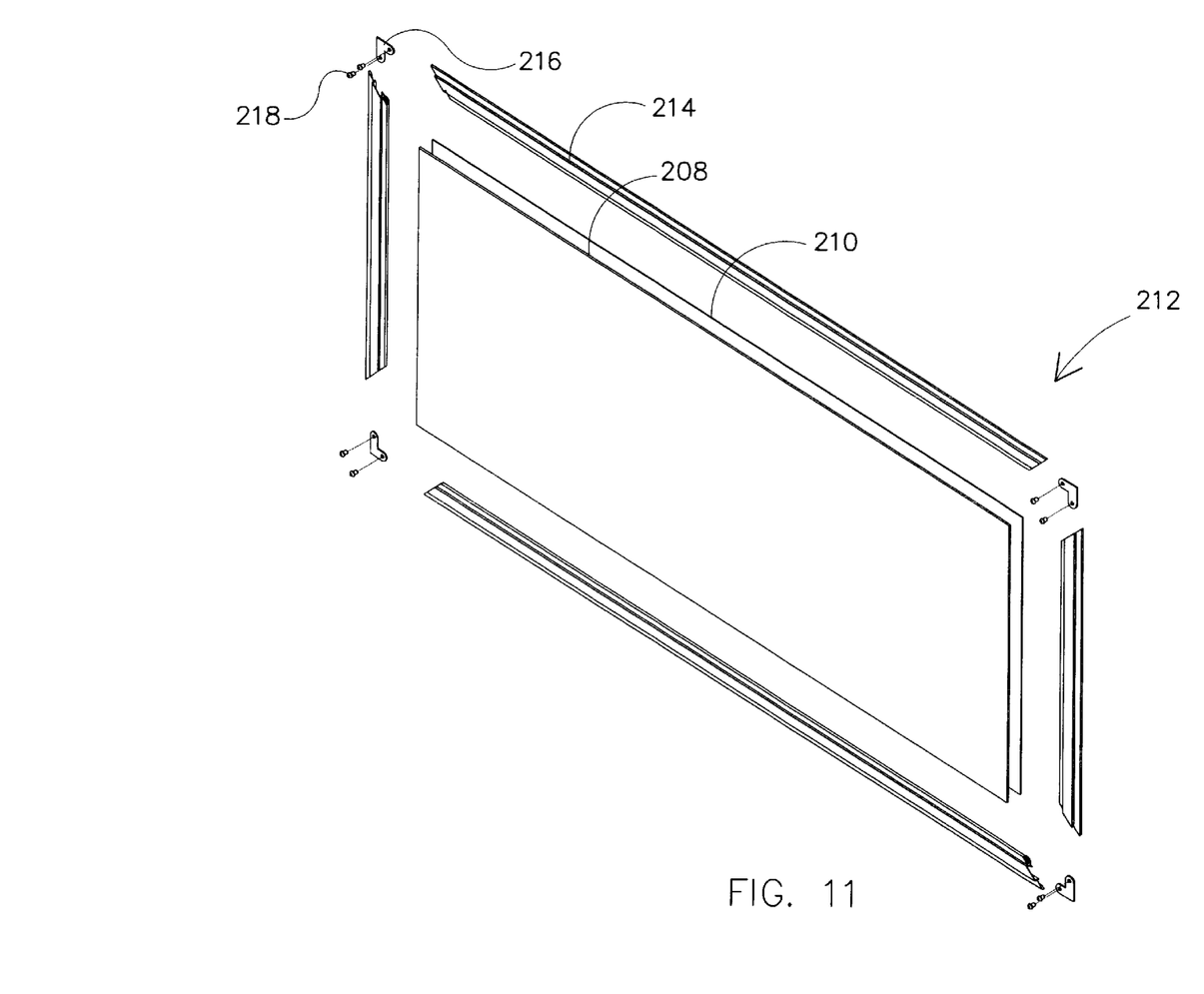
FIG. 11 is an exploded perspective view of the window from the enclosure of FIG. 1.

Referring to FIG. 11, window 18 includes a transparent front cover 208 extending over and substantially covering a screen 210. In this exemplary embodiment, front cover 208 is clear or has a red tint. Front cover 208 and screen 210 slidably connect to a sectional window frame 212, thereby enclosing front cover 208 and screen 210. Window frame 212 includes frame edge extrusions 214 connected at each corner of window frame 212 by frame corner brackets 216 and frame fasteners 218. Connecting window frame 212, in the manner described above, eliminates secondary operations such as drilling or punching, followed by tapping, of holes into side walls 12 or window 18 to accommodate fasteners.

Figure 12:
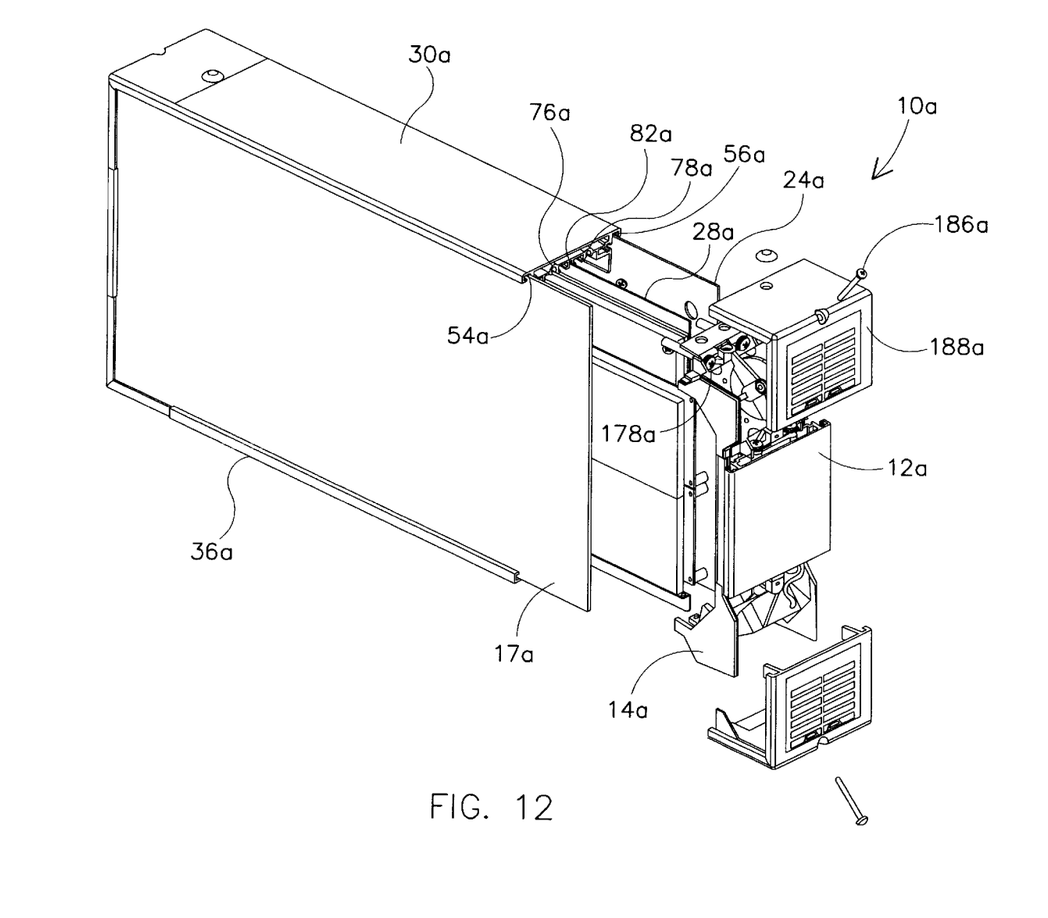
FIG. 12 is an exploded front perspective view of a enclosure according to a second embodiment of the invention.

Referring to FIG. 12, an enclosure 10a according to an alternative embodiment is shown. Enclosure 10a includes a module rack 28a slidably connected to upper and lower side walls 30a, 36a at a center groove 82a. Front panel 17a and rear panel 24a also slidably connect to enclosure 10a at front and rear channels 54a, 56a of upper and lower side walls 30a, 36a, respectively. Front panel 17a, rear panel 24a and module rack 28a are inserted into or removed from enclosure 10a by removing one side wall 12a. Access to front panel 17a, rear panel 24a and module rack 28a is readily achieved by removing cover screw 186a and cover 188a from two corner assemblies 14a and then removing circular slot screws 178a from first and second circular slots 76a, 78a thereby allowing right side wall 31a (or left side wall 33a) and two corner assemblies 14a to be removed as one piece. Slidably connecting rear panel 24a, front panel 17a and module rack 28a to side walls eliminates secondary operations such as drilling or punching, followed by tapping, of holes into side walls 12a rear panel 24a, module rack 28a or front panel 17a to accommodate fasteners. According to another alternate embodiment front panel, rear panel and module rack slidably couple with a snap-tight fit to side wall.

In an exemplary embodiment, air flow through enclosure 10 is provided by fans 38 mounted to each corner assembly 14. Body 130, cover 188 and louver 22 of corner assembly 14 form an air plenum allowing for air to pass into and out of enclosure 10. Two fans 38 are configured to pull air into enclosure 10 and the remaining two fans 38 are configured to discharge air from enclosure 10. In an alternative embodiment, enclosure 10 contains two fans 38, one fan 38 drawing air into enclosure 10 and a second fan 38 discharging air. In another alternative embodiment, enclosure includes a single fan 38 for drawing into or discharging air from enclosure 10. In another alternative embodiment, no fans are used, air flow passes through enclosure 10 by natural circulation or other means through air plenum of corner assemblies 14.

A method of manufacturing the exemplary embodiment of FIG. 1 includes extruding or obtaining side walls 12. The method further includes cutting side walls 12 to the desired lengths. Side walls 12 can be cut to any length allowing the length and width of enclosure 10 to adapt to a large number of different sizes for varying applications. The method further includes mounting equipment to equipment sub-panel 206, and mounting equipment sub-panel 206 to rear panel 24. The method further includes mounting fans 38 to corner assemblies 14, assembling hinged module rack 26 and assembling front panel 17. The method further includes sliding bolts 102 into mounting slots 92, 93 of upper and lower side walls 30, 36. Then, the method includes connecting hinged module rack 26 to bolts 102 of upper side wall 30 with module rack nuts 114. The method further includes sliding nuts 98 into the front and rear t-shaped channels 72, 74 of side walls 12. The method further includes sliding side walls 12 on to corner assemblies 14 such that adjacent tongues 164 enter mounting slots 92, 93, and placing circular slot screws 178 into first and second circular slots 76, 78 of side walls 12. The method further includes placing front panel 17 and rear panel 24 on bracing member 70, 71 of side walls 12, respectively. The method further includes placing screw 100, clip 20 and nut 98 assembly in front and rear t-shaped channels 72, 74 securing front panel 17 and rear panel 24 to side walls 12.

According to an exemplary embodiment, mounting brackets for wall mounting or top hanging are attached to the enclosure. According to an exemplary embodiment, side walls 12, rear panel 24 and corner assembly cover 188 can be provided in a number of different colors to coordinate the enclosure to a decor.

While the embodiments illustrated in the FIGURES and described above are presently preferred, it should be understood that these embodiments are offered by way of example only, and various alternatives would be apparent to those of skill in the art. For example, a light box (a box containing fluorescent lights) maybe installed within enclosure 10 in place of display modules 32. In another alternative embodiment, the equipment is mounted directly to the rear panel without an equipment sub-panel. In another alternative embodiment, the side wall extrusion does not contain the channel, the center groove, or the front and rear channels. In another alternative embodiment, the hinge bracket is connected to side wall in a lower position or a side position and the hinged module rack rotates forward from the top of the enclosure or the side of the enclosure. In another alternative embodiment, the hinged module racket rearwardly rotates allowing rear access to the front panel.

What is claimed is:

1. An enclosure for electronic displays, comprising:
a frame having a side portion;
at least one coupling assembly coupled to the side portion, wherein one of the coupling assembly and the side portion includes a plurality of recesses and the other of the coupling assembly and the side portion includes a plurality of protrusions configured for mating alignment with the recesses;
a display module disposed within the frame.

2. The enclosure of claim 1, wherein the coupling assembly is an aluminum casting.

3. The enclosure of claim 1, further comprising at least two supports, each support connected to a separate coupling assembly.

4. The enclosure of claim 1, further comprising a module panel coupled to the frame, the module panel having a plurality of edges and being rotatable about one edge, the display module coupled to the module panel.

5. The enclosure of claim 1, wherein the coupling assembly comprises:
a body; and
a fan coupled to the body.

6. The enclosure of claim 5, further comprising
a cover coupled to the body;
a louver coupled to the cover, wherein the cover has an opening covered by the louver, and
the cover, the body and the louver form a plenum whereby air can freely move into and out of the enclosure.

7. The enclosure of claim 1, wherein the frame includes a plurality of side walls, the side walls having an inner surface.

8. The enclosure of claim 7, wherein each side wall is an extrusion.

9. The enclosure of claim 1 further comprising a module rack rotatably coupled about an axis longitudinally extending across the inner surface of one side wall.

10. The enclosure of claim 9, further comprising at least one bar coupled to the module panel, whereby the safety bar extends to secure the module panel in an open position for allowing access to the rear panel.

11. The enclosure of claim 1, further comprising a front panel coupled to the frame; and a rear panel coupled to the frame.

12. The enclosure of claim 11, wherein the frame includes the plurality of recesses configured to retain a plurality of fasteners to couple one of the front panel, the rear panel and an equipment panel to the frame, whereby secondary operations such as drilling holes or punching holes in the side wall for accommodating the fasteners are unnecessary.

13. The enclosure of claim 11, further comprising an equipment sub-panel coupled to the rear panel.

14. The enclosure of claim 11, wherein the rear panel and the front panel are removably connected to the frame by clips.

15. An enclosure for electronic displays comprising:
   a plurality of side walls, each side wall having a plurality of recesses;
   at least one corner assembly;
   a means for coupling two side walls to each corner assembly;
   a front panel coupled to at least one side wall;
   a rear panel coupled to at least one side wall; and
   a display module disposed in the enclosure.

16. The enclosure of claim 15 further comprising:
   a means for coupling a hinged module panel to at least one side wall; and
   at least one display module coupled to the hinged module panel.

17. The enclosure of claim 15 further comprising at least one fan, each fan coupled to a separate corner assembly.

18. The enclosure of claim 16 further including fasteners wherein the plurality of recesses are configured to retain the fasteners for coupling the front panel, rear panel or the module panel to at least one side wall.

19. An enclosure for electronic displays comprising:
   at least two side walls, at least one side wall having a plurality of recesses;
   at least two corner assemblies, each corner assembly connecting two side walls to form a frame;
   a front panel slidably coupled to the side walls;
   a rear panel slidably coupled to the side walls;
   a module panel slidably coupled to the side walls; and
   at least one display module coupled to the module panel.

20. The enclosure of claim 19, wherein each side wall is an extrusion.

21. A method of manufacturing an enclosure for electronic displays, comprising:
   providing at least one side wall;
   providing a corner assembly, wherein the side wall has a plurality of recesses and the corner assembly has a plurality of corresponding protrusions for mating engagement with the plurality of recesses; and
   sliding the protrusions into the recesses to form a secure fit, whereby secondary operations, such as drilling holes or punching holes, in the side wall are unnecessary to complete the mating engagement.

22. The method of manufacturing an enclosure of claim 21, further comprising:
   sliding a plurality of fasteners into at least one of the recesses;
   connecting a module panel to the fasteners;
   coupling a front panel to at least one side wall; and
   coupling a rear panel to at least one side wall.

23. The method of manufacturing an enclosure of claim 21, further comprising:
   extruding at least one side wall; and
   cutting the side wall to the desired length.

24. The method of manufacturing an enclosure of claim 22, further comprising:
   mounting equipment to an equipment sub-panel; and
   mounting the equipment sub-panel to the rear panel.

25. The method of manufacturing an enclosure of claim 22, further comprising coupling at least one display module to the module panel.

26. The method of manufacturing an enclosure of claim 22, further comprising assembling the front panel.

* * * * *